United States Patent
Rodrigues et al.

(10) Patent No.: US 10,115,850 B2
(45) Date of Patent: Oct. 30, 2018

(54) ROOF INTEGRATED SOLAR PANEL SYSTEM WITH SIDE MOUNTED MICRO INVERTERS

(71) Applicant: Building Materials Investment Corporation, Dallas, TX (US)

(72) Inventors: Tommy F. Rodrigues, Nutley, NJ (US); Sudhir Railkar, Wayne, NJ (US); Daniel E. Boss, Murphy, TX (US); David J. Gennrich, Fitchburg, WI (US); Cory Boudreau, Lake Elmo, MN (US); Daniel R. Nett, Sun Prairie, WI (US); Kent J. Kallsen, Jefferson, WI (US)

(73) Assignee: Building Materials Investment Corporation, Dallas, TX (US)

( * ) Notice: Subject to any disclaimer, the term of this patent is extended or adjusted under 35 U.S.C. 154(b) by 700 days.

(21) Appl. No.: 14/044,196

(22) Filed: Oct. 2, 2013

(65) Prior Publication Data

US 2014/0090697 A1    Apr. 3, 2014

Related U.S. Application Data

(60) Provisional application No. 61/708,822, filed on Oct. 2, 2012.

(51) Int. Cl.
*H01L 31/04* (2014.01)
*H01L 31/048* (2014.01)
*H02S 40/32* (2014.01)
*H02S 20/23* (2014.01)

(52) U.S. Cl.
CPC .......... *H01L 31/0482* (2013.01); *H02S 20/23* (2014.12); *H02S 40/32* (2014.12); *Y02B 10/12* (2013.01); *Y02B 10/14* (2013.01)

(58) Field of Classification Search
CPC ....... H01L 31/0482; H02S 40/32; H02S 20/23
USPC .................................. 136/242–265; 52/173.3
See application file for complete search history.

(56) References Cited

U.S. PATENT DOCUMENTS

| 7,819,114 B2 | 10/2010 | Augenbraun et al. |
| 7,824,191 B1 | 11/2010 | Browder |
| 8,371,076 B2 | 2/2013 | Jones et al. |
| 2006/0042683 A1* | 3/2006 | Gangemi .......... H01L 31/02008 136/252 |

(Continued)

OTHER PUBLICATIONS

SolarGain: Solar Energy Specialists, "APS—Micro Inverter Technology," http://www.solargain.com.au/aps-micro-inverter, Apr. 10, 2013.

(Continued)

*Primary Examiner* — Magali P Slawski
*Assistant Examiner* — Kourtney R S Carlson
(74) *Attorney, Agent, or Firm* — Womble Bond Dickinson (US) LLP

(57) ABSTRACT

A roof integrated solar panel system includes a plurality of solar panel modules, each modules having a frame, a photovoltaic panel mounted to the frame, and a micro-inverter mounted to the frame to one side of the photovoltaic panel and accessible from the top of the frame. The solar panel modules are installable on a roof in aligned or staggered courses to form the solar panel system, and with the installed courses of modules together forming a water barrier protecting the roof.

14 Claims, 2 Drawing Sheets

(56) References Cited

U.S. PATENT DOCUMENTS

| | | | |
|---|---|---|---|
| 2009/0114261 A1* | 5/2009 | Stancel | H01L 31/05 |
| | | | 136/244 |
| 2011/0036386 A1 | 2/2011 | Browder | |
| 2011/0048507 A1* | 3/2011 | Livsey | F24J 2/5245 |
| | | | 136/251 |
| 2011/0058337 A1* | 3/2011 | Han | H02S 40/34 |
| | | | 361/717 |
| 2011/0132427 A1* | 6/2011 | Kalkanoglu | H01L 31/0482 |
| | | | 136/244 |
| 2011/0302859 A1 | 12/2011 | Crasnianski | |
| 2012/0212065 A1 | 8/2012 | Cheng et al. | |
| 2012/0233940 A1* | 9/2012 | Perkins | F24J 2/5211 |
| | | | 52/173.3 |
| 2012/0240490 A1 | 9/2012 | Gangemi | |
| 2013/0014455 A1* | 1/2013 | Grieco | H02S 20/25 |
| | | | 52/173.3 |

OTHER PUBLICATIONS

Wholesale Solar, "AUO AC Unison PM250MA0 250-watt AC Solar Panel," http://www.wholesalesolar.com/products.folder/module-folder/AUO/AC-Unison-PM250MA0.html, Apr. 10, 2013.

\* cited by examiner

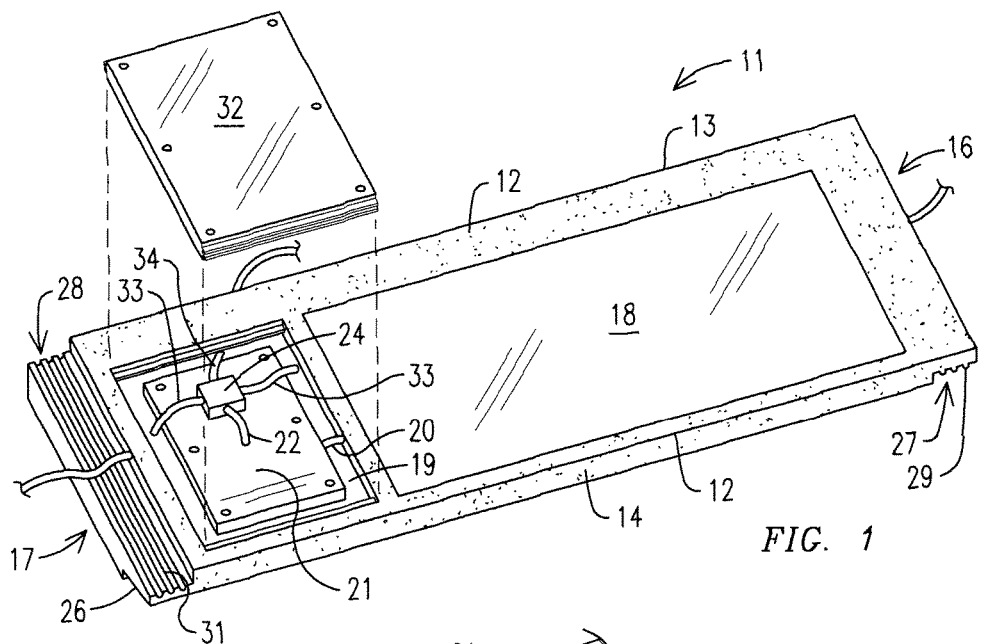
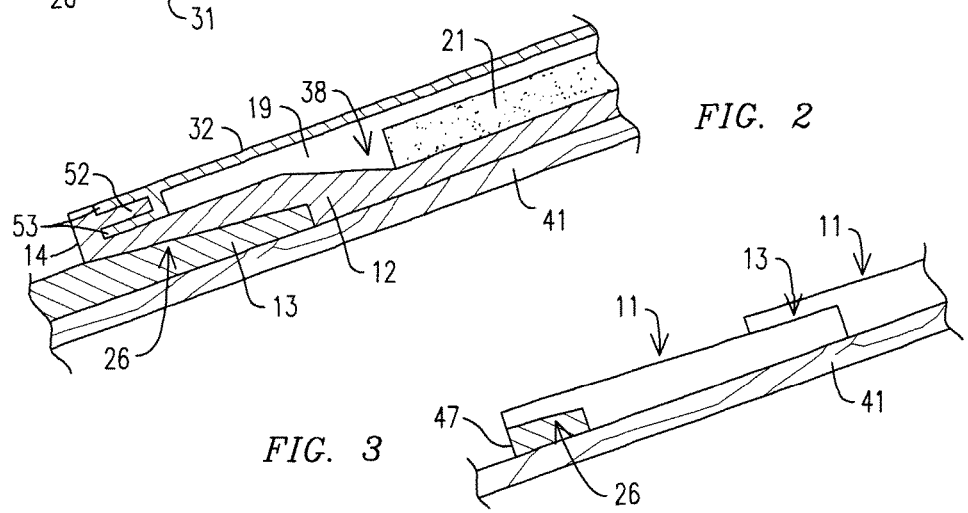
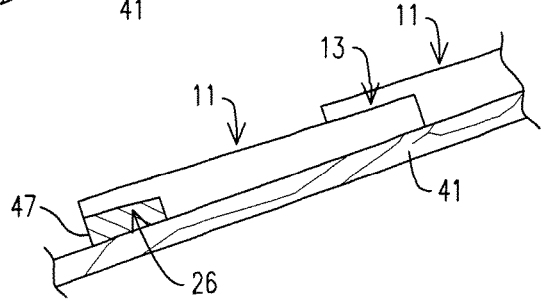
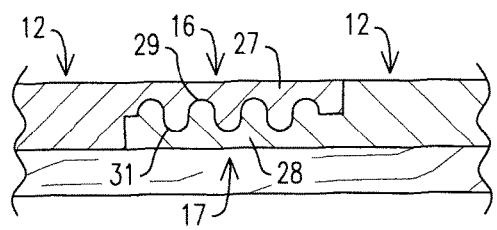
FIG. 1
FIG. 2
FIG. 3
FIG. 4

ROOF INTEGRATED SOLAR PANEL SYSTEM WITH SIDE MOUNTED MICRO INVERTERS

RELATED APPLICATIONS

This application claims the benefit of U.S. Provisional Patent Application No. 61/708,822, filed on 2 Oct. 2012, and entitled "Roof Integrated Solar Panel System with Side Mounted Micro Inventers", which application is incorporated by reference in its entirety herein.

TECHNICAL FIELD

This disclosure relates generally to photovoltaic energy production and more specifically to solar panels and associated systems configured to be mounted on the roof of a building for producing electrical energy when exposed to sunlight.

BACKGROUND

Collecting energy directly from the sun has drawn more and more interest in the past several years as people and industries turn to more sustainable forms of energy production. One way to collect energy from the sun is through the use of photovoltaic panels that generate electrical energy when the panels are exposed to sunlight. Large numbers of such panels can be erected in an array and electrically interconnected to generate correspondingly large volumes of electrical energy. Such photovoltaic arrays have been used to supply electrical power for commercial manufacturing plants, wineries, commercial buildings, and even domestic buildings. Such systems unfortunately tend to be large, bulky, unsightly, and generally not aesthetically desirable for installation on the roof of one's home.

More recently, photovoltaic systems have been developed that are designed to be installed on the roof of a residential home and, when installed, to present a more pleasing and acceptable appearance. One example is the Powerhouse® brand solar shingle from Dow Solar, which is relatively flat, installed in a manner similar to normal asphalt shingles, and at least to some degree resembles ordinary shingles. These more recent systems, while a step in the right direction, have generally been less acceptable than expected for a number of reasons including their tendency to leak, their susceptibility to large reductions in efficiency when one or a few panels of the system are shaded, and the difficulty of detecting and replacing defective panels and/or defective electrical connections beneath the panels. These systems generally also require large inverters in a garage or other location that convert the direct current (DC) electrical energy generated by the panels to alternating current (AC) electrical energy for connection to the public grid.

A need persists for a roof integrated solar panel system that addresses the above and other problems and shortcomings, that is suitable in appearance and function for use on the roofs of residential homes, and that is easily installed and easily serviced when necessary. It is to the provision of such a system that the present invention is primarily directed.

SUMMARY

Briefly described, a roof integrated solar panel system is disclosed for installation on the roof of a residential home to produce electrical energy when exposed to the sun. By "roof integrated" it is meant that the system also functions as the roofing membrane or water barrier of the building to shed water and protect the roof deck. The system comprises a plurality of solar modules each including a frame, a photovoltaic or solar panel mounted to the frame, and an electronics compartment defined in the frame to one side of the photovoltaic panel. The electronics compartment is generally formed in or accessible from the top surface of the frame. A micro-inverter is mounted in the electronics compartment and is electrically connected to the photovoltaic panel of the module to convert the DC energy produced by the photovoltaic panel to AC energy for distribution. Also located in the electronics compartment and accessible from the top surface of the frame is an electrical connection block for coupling the AC energy from the micro-inverter of the module to AC energy generated by others of the plurality of modules in the system. The aggregated AC electrical energy generated by the plurality of solar modules can then be delivered to the public electrical grid, used directly to power appliances, or stored in a battery bank for later use. These and other features, aspects, and advantages of the system of this disclosure will become more apparent upon review of the detailed description set forth below when taken in conjunction with the accompanying drawing figures, which are briefly described as follows.

BRIEF DESCRIPTION OF THE DRAWINGS

FIG. 1 is a perspective partially exploded view of one module of a roof integrated solar panel system according to one embodiment of the invention.

FIG. 2 is a partial cross sectional view along line 2-2 of FIG. 1a showing the electronics compartment and a micro-inverter, wiring, and connection block contained therein.

FIG. 3 is a side elevational view of two modules of the roof solar panel system illustrating a starter strip and a head lap between courses of solar panel modules.

FIG. 4 is a partial cross sectional view along line 4-4 of FIG. 1a showing a water managing shiplap joint at the ends of two solar panel modules.

DETAILED DESCRIPTION

Figure 1A:
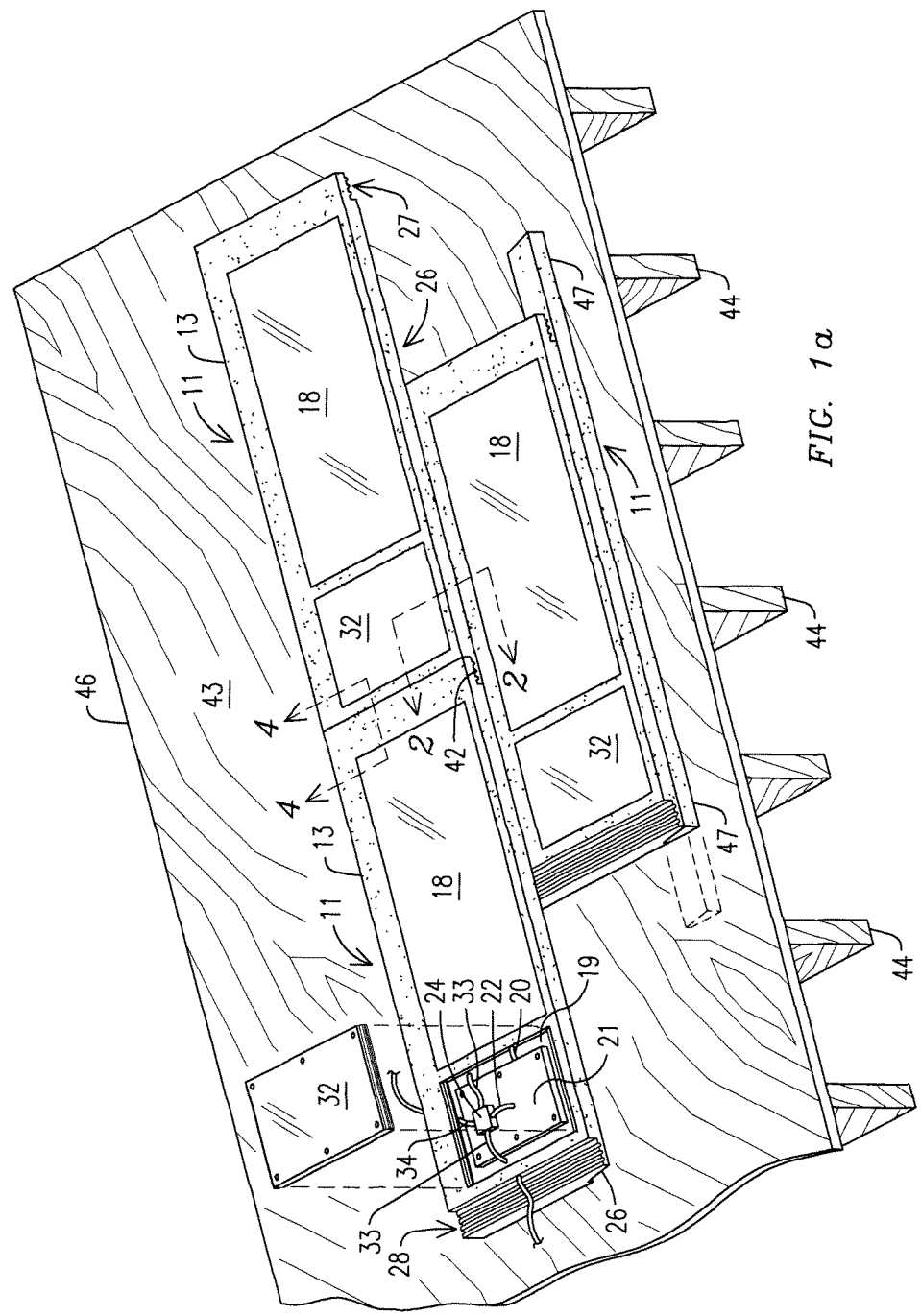
FIG. 1a is a simplified perspective illustration of a roof integrated solar panel system comprising a plurality of modules according to FIG. 1 mounted on a roof deck.

Referring now in more detail to the drawing figures, wherein like reference numerals, where appropriate, indicate like parts throughout the several views, FIG. 1 illustrates a single module 11 of a roof integrated solar panel system according to the invention. The module 11 comprises a frame 12 that can be made of any appropriate material such as, for instance, molded or extruded plastic, aluminum, a polymer composite material, or other material resistant to sun and the weather. The frame has a rear edge portion 13, a front edge portion 14, a right end portion 16, and a left end portion 17. A photovoltaic panel 18 is mounted to or recessed in the top surface of the frame for exposure to sunlight. The photovoltaic panel 18 may conventionally comprise an array of solar cells electrically connected together to form the panel or may comprise any type of photovoltaic technology capable of converting solar energy to electrical energy. The photovoltaic panel 18 may be covered with a protective material such as glass, a polymer, an epoxy, or similar material to protect the photovoltaic panel from the elements and to inhibit water leakage.

The frame 12 is further formed to define a recessed electronics compartment 19 spaced from one end of the photovoltaic panel, and that is formed in or accessible from the top surface of the frame. A micro-inverter 21 is contained within the electronics compartment 19 and is connected through a wire 20 to the photovoltaic panel 18 of the module. The micro-inverter, which is a commercially available product available from a number of suppliers such as, for example, Enphase Energy of Petaluma, Calif., functions to convert DC energy produced by the photovoltaic panel 18 to AC energy, preferably at a common frequency such as 60 cycles per second (Hz). Doing the DC-AC conversion on the module itself has been found to be more efficient than directing aggregated DC electrical energy from a plurality of solar panels to a remotely located large capacity inverter somewhere else in a home.

The AC output of the micro-inverter is directed through wire 22 to AC connection block 24, also located within the electronics compartment 19 and accessible from the top surface of the frame. The AC connection block 24 is configured to allow the AC output of other modules of the system to be interconnected so that the AC outputs of all the modules is can be aggregated into a single AC output that can be connected to the electrical grid, power appliances, or otherwise used. For example, wire 33 may connect to the AC connection block 24 from the micro-inverter of the next adjacent module of the system while wire 34 may connect to the AC connection block of a module in a next higher course of modules in a system. In this way, the AC output of each module is aggregated and can be applied through a trunk line to its eventual use.

A removable access panel 32 is sized and configured to be mounted to the top of the module and covering the electronics compartment to provide aesthetic appeal and to protect components in the electronics compartment, and is accessible from the top surface of the frame. The access panel 32 can be made to match the frame 12 or the photovoltaic panel 18 in appearance if desired, or it may be configured to contrast with the frame or photovoltaic panel. In one aspect, the top surface of the access panel 32 can be substantially flush with the top surface of the photovoltaic panel 18, and both the top surface of the access panel 32 and the top surface of the photovoltaic panel 18 may or may not be substantially flush with the top surface of the frame 12.

The right end portion 16 of the frame 12 is formed with a laterally extending overlap 27 having channels 29 formed on its underside. Similarly, the left end portion 17 of the frame 12 is formed with a laterally extending underlap 28 also having channels 31 formed therealong. The channels 31 are configured to engage and mesh with the channels 27 when two modules of the system are connected end-to-end as described in more detail below. A tapered recess 26 is formed along the underside of the front edge portion 14 of the frame 12. As detailed below, the recess 26 is sized and configured to receive rear edge portion 13 of a like module 11 in a next lower course of modules of a system. As a result, the modules can form a water barrier when assembled together on a roof deck that also provides water shedding during rain that protects the roof.

It will be appreciated that when a plurality of modules 11 are installed on a roof, the thickness of each module can be minimized to improve aesthetics since the micro-inverters are not mounted on the backs of the photovoltaic panels but rather to their sides and accessible from the top of the frame. Further, if a micro-inverter of a module should fail or an AC connection block require access, it is a simple matter to remove the corresponding access panel 32, make the needed repairs, and replace the access panel. An entire module also can be replaced if defective simply by removing the access panel, disconnecting the module at the connection block, moving it, replacing it with a new module, and rewiring the new module within the electronics compartment. This is in stark contrast to traditional solar shingles, which must be removed from the roof deck to effect repairs and are not easily replaced when defective.

FIG. 1a shows a roof integrated solar panel system comprising a plurality of solar panel modules 11 installed on the deck 43 of a roof. The roof deck in this illustration is plywood supported by roof rafters 44 and extends upwardly at a pitch to a roof ridge 46. Only three modules are shown in this illustration, but it should be understood that a typical system may include many more modules installed and interconnected as shown in FIG. 1a. Two modules 11 are illustrated here in an upper course of modules while one module 11 is illustrated in a lower course of modules. For the lower and top right modules, the access panels 32 are shown attached and covering the electronics compartment 19 of these modules while the access panel 32 is shown removed from the electronics compartment of the upper left module. The two modules 11 of the top course are mounted end-to-end with the overlap 27 of the left module overlying and meshed with the underlap 28 of the right panel to form a shiplap. The modules may be secured to the roof deck 43 with nails, screws, or other fasteners (not shown) preferably driven through the upper edge or headlap portions of the modules and into the roof deck below. Fasteners also may be driven through other portions of the modules as needed.

As may be appreciated by one of skill in the art, the process of converting the DC electrical energy to AC electrical energy can produce significant heat. Consequently, positioning the micro-inverter 21 to one side of the photovoltaic panel 18, rather than on the back or below the photovoltaic panel, can be advantageous by relocating the heat source out from under photovoltaic components that may be affected by higher ambient temperatures. As a result, the modules 11 can be installed directly to the deck 43 of the roof rather than elevated on a frame above the deck, as with some prior art systems, to provide ventilation for conversion modules that are mounted on the backs or below the photovoltaic panels.

The upper edge or headlap portion of the module 11 in the lower course is shown received within the recess 26 of the upper course of modules. In this way, the lower edge portions of the upper course of modules overlaps the headlap portions of a lower course of shingles to facilitate water shedding. A starter strip 47 is affixed to the roof deck along the forward edges of a lowermost course of modules and fills the recesses 26 of these modules. The starter strip may be formed of any appropriate material such as plastic, wood, a composite, or other material and extends along the lower edges of the lowermost course of modules and provides a substrate to which the lowermost course of modules may be affixed along their forward edges. Sealant may be applied between the starter strip 47 and the modules to inhibit windblown water from penetrating beneath the lowermost course of modules. The wiring 20, 33, and 34 as well as any additional wiring may easily be routed through the frames 13 of the modules and all electrical connections are made within the electronics compartments 19 during installation of a system of modules.

FIG. 2 is a partial cross-sectional view taken along line 2-2 of FIG. 1a illustrating one configuration of the electronics compartment of a module according to the invention. The frame 12 of the module 11 is shown resting on a roof deck 41 with the rear or headlap portion 13 of a next lower module received in the recess 26. The frame 12 of the upper module 11 is formed with a recessed area 38 that defines the electronics compartment 19. A micro-inverter 21 is shown disposed within the electronics compartment fastened to the floor of the recessed area in this case. Access panel 32 is shown covering the electronics compartment. Preferably, the recessed area is formed such that an air space surrounds the micro-inverter 21 within the compartment to facilitate cooling of the electronics compartment 19. In the illustrated embodiment, the access panel 32 has a forward edge formed with a pair of fingers 53 shaped to receive a tongue formed along the forward edge of the recessed area 38. In this way, the forward edge of the access panel is securely fixed to the frame and water leakage into the electronics compartment 19 along this edge is inhibited.

FIG. 3 illustrates the starter strip 47 and overlying arrangement of modules 11 in a system of the present invention. As described above, the starter strip is fixed to the roof deck 41 and is received in the recess 26 of the lowermost course of modules of a system. The recesses along forward edges of modules in the next higher course of modules receives and overlaps the headlap portions of a lower course of modules to facilitate water shedding. FIG. 4 illustrates the end-to-end connection between two modules 11 in the same course in the same course of modules. The overlap portion 27 of the left module is formed along its bottom surface with a series of ridges and troughs that form grooves 29 extending along the underside of the overlap. Similarly, the underlap portion 28 of the right module is formed along its top surface with a series of complementing ridges and troughs that form grooves 31 extending along the upper surface of the underlap portion 28. When two modules are joined end-to-end as shown, the grooves mesh with each other as shown in FIG. 4. This, in turn, prevents water from migrating laterally across the shiplap joint formed by the overlap and underlap portions and thereby inhibits leakage between modules in a course of modules.

The roof integrated solar panel system of this invention is installed on a roof deck as illustrated in FIG. 1a in courses. A starter strip is installed along the bottom edge of the installation and the first course of modules is installed against the starter strip. The next higher course of modules is then installed with the grooves 26 of the modules overlapping the rear edge or headlap portions of the lower course modules. Preferably, the modules of adjacent courses are staggered with respect to one another as shown in FIG. 1a to enhance the water shedding and leak resistant properties of the installed system. Any water that may seep into the shiplap joints of an upper course is directed along the grooves of the joint onto the mid portion of a lower module where it is shed away.

As each module is installed on a roof deck, or after installation of the entire system, the modules are electrically connected together. This is done using connector blocks 24 located within the electrical compartment 19. The connector blocks electrically connect the micro-inverters of each module in a course to the micro-inverters in other modules of the course through wires 33 that are hidden beneath the modules. Likewise, the micro-inverters of each course are connected to those of a next higher (or lower) course through wires 34 that also are hidden beneath the modules. In the preferred embodiment, the micro-inverters are electrically connected in parallel so that the total voltage of the system is substantially the same as the voltage of one of the micro-inverters while the electrical current capacity of the system is substantially the sum of the current capacities of all of the micro-inverters. The total power developed by the system can then be connected through a trunk wire, buss, or otherwise to the public electrical grid, to appliances in the home, or other destinations.

With the modules installed and wired, the electrical compartments of the modules are covered by their access panels 32 to complete the installation. The interface between the access panels and the top of the frame 12 can be made water tight if desired, so that the micro-inverter is positioned below the water barrier and water shedding is accomplished across the tops of the access panels during rain. Alternatively, water may be allowed to leak into the electrical compartments which may be provided with appropriate drainage systems or weep holes so that the micro-inverter is positioned above the water barrier and the water shedding is accomplished from within the electrical compartments. In the later case, vents may be formed in the access panels to vent heated air from within the electrical compartments to ambience to help maintain the temperature of the micro-inverters within acceptable ranges.

It will be appreciated, moreover, that with either configuration the primary water barrier provided by the frames 12 of the assembled solar power modules 11 may not be breached or interrupted during repairs, adjustments or upgrades to the electrical components located with the electronics compartments 19, and that are accessible from the top of the modules 11.

The invention has been described herein in terms of preferred embodiments and methodologies considered by the inventor to represent the best mode of carrying out the invention. It will be understood by the skilled artisan; however, that a wide range of additions, deletions, and modifications, both subtle and gross, may be made to the illustrated and exemplary embodiments without departing from the spirit and scope of the invention disclosed herein.

What is claimed is:

1. A roof integrated solar power system for generating electrical power from sunlight, the solar power system comprising:
    a plurality of modules configured to be installed in overlapping courses on a roof, each module including:
    a frame having a top surface with an exposure portion to be exposed to sunlight when the module is installed and a headlap portion to be covered by a module in a next higher course of modules when the power system is installed, the exposure portion having opposed ends;
    a photovoltaic panel recess formed in the exposure portion of the frame, the photovoltaic panel recess having a first end adjacent one of the opposed ends of the frame and a second end spaced from the other one of the opposed ends of the frame;
    a photovoltaic panel having ends, a forward edge, a rear edge, and a top surface and being mounted within the photovoltaic panel recess;
    an electronics compartment recess formed in the exposure portion of the frame within the space between the second end of the photovoltaic panel recess and the other one of the opposed ends of the frame;
    a micro-inverter and first wiring mounted within the electronics compartment recess; an access panel removably attached to the top of the frame covering the electronics compartment recess, the access panel having a forward edge aligned with the forward edge of the photovoltaic panel and a rear edge aligned with the rear edge of the photovoltaic panel when the access panel is attached to the top of the frame; and a top surface of the access panel and the top surface of the photovoltaic panel being flush with the top surface of the frame.

2. The solar power system of claim 1, wherein the frame further includes a left end defining a first shiplap joint portion and a right end defining a second shiplap joint portion complimentary with the first shiplap joint portion, with the first and second shiplap joint portions together forming an end-to-end shiplap joint connection between adjacent modules on a same course of modules.

3. The solar power system of claim 2, further comprising second wiring extending across the end-to-end shiplap joint connections between adjacent modules on a same course of modules and below the top surface of the frames of the plurality of modules.

4. The solar power system of claim 1, further comprising third wiring hidden below the top surfaces of the frames of the plurality of modules and in electrical communication with electrical connectors located within the electronics compartment recesses of the plurality of modules, the electrical connectors and electrical wires being configured to connect the micro-inverters of one course of modules together and to connect the micro-inverters of the one course to micro-inverters of an adjacent course of modules.

5. The solar power system of claim 1, wherein the installed courses of modules together form a water barrier protecting the roof.

6. The solar power system of claim 5, wherein the micro-inverters are positioned below the water barrier.

7. The solar power system of claim 6, wherein the access panel is removably attached to the top of the frame with a water-tight seal.

8. The solar power system of claim 1, wherein the electronics compartment recess is vented to ambience.

9. A solar panel module comprising:
a frame having a top surface with an exposure portion and a headlap portion;
a photovoltaic panel having ends, a forward edge, a rear edge, and a top surface and being mounted to the exposure portion of the top surface of the frame;
an electronics compartment recess formed into the exposure portion of the top surface of the frame;
the electronics compartment recess being adjacent to one end of and spaced from the photovoltaic panel and being covered by an access panel having a top surface and being removably attached to the top of the frame, the access panel having a forward edge aligned with the forward edge of the photovoltaic panel and a rear edge aligned with the rear edge of the photovoltaic panel;
the top surface of the access panel and the top surface of the photovoltaic panel being flush with the top surface of the frame when the access panel is attached to the top surface of the frame;
a micro-inverter mounted within the electronics compartment recess and being accessible from the top of the frame upon removal of the access panel; and
an electrical connector disposed within the electronics compartment recess and being connectable with the micro-inverter for electrically connecting the micro-inverter to micro-inverters of adjacent like solar panel modules.

10. The solar panel module of claim 9, wherein the solar panel module further comprises a water barrier.

11. The solar panel module of claim 10, wherein the micro-inverter is positioned below the water barrier.

12. The solar panel module of claim 11, wherein the access panel is removably attached to the top of the frame with a water-tight seal.

13. The solar panel module of claim 10, wherein the micro-inverter is positioned above the water barrier.

14. The solar panel system of claim 13, wherein the electronics compartment recess is vented to ambience.

* * * * *